United States Patent [19]

Eigenbrode, deceased

[11] Patent Number: 4,552,420
[45] Date of Patent: Nov. 12, 1985

[54] ELECTRICAL CONNECTOR USING A FLEXIBLE CIRCUIT HAVING AN IMPEDANCE CONTROL ARRANGEMENT THEREON

[75] Inventor: George T. Eigenbrode, deceased, late of Camp Hill, Pa., by Judy E. Eigenbrode, executrix

[73] Assignee: E. I. Du Pont de Nemours and Company, Wilmington, Del.

[21] Appl. No.: 557,702

[22] Filed: Dec. 2, 1983

[51] Int. Cl.$^4$ .............................................. H01R 4/66
[52] U.S. Cl. ................................. 339/14 R; 339/17 M
[58] Field of Search ............... 339/14 R, 17 M, 17 F, 339/176 MF, 17 L

[56] References Cited

U.S. PATENT DOCUMENTS

| | | | |
|---|---|---|---|
| 3,582,865 | 6/1971 | Franck et al. ...................... | 339/17 L |
| 3,643,201 | 2/1972 | Harwood ...................... | 339/14 R X |
| 3,951,493 | 4/1976 | Kozel et al. ...................... | 339/17 M |
| 4,227,767 | 10/1980 | Mouissie ...................... | 339/176 MF |

FOREIGN PATENT DOCUMENTS 1410779 10/1975 United Kingdom ............. 339/17 M

*Primary Examiner*—Eugene F. Desmond

[57] ABSTRACT

A connector having a core with a flexible circuit supported therearound, the flexible circuit having an array of signal conduction tracings on the first, exterior, surface thereof, the connector being characterized in that the second, interior, surface of the flexible circuit has an impedance control arrangement comprising at least one ground tracing connectable to ground potential and arranged with respect to the signal conduction tracings such that the impedance of the signal conduction tracings matches the impedance of conduction paths to be interconnected.

22 Claims, 15 Drawing Figures

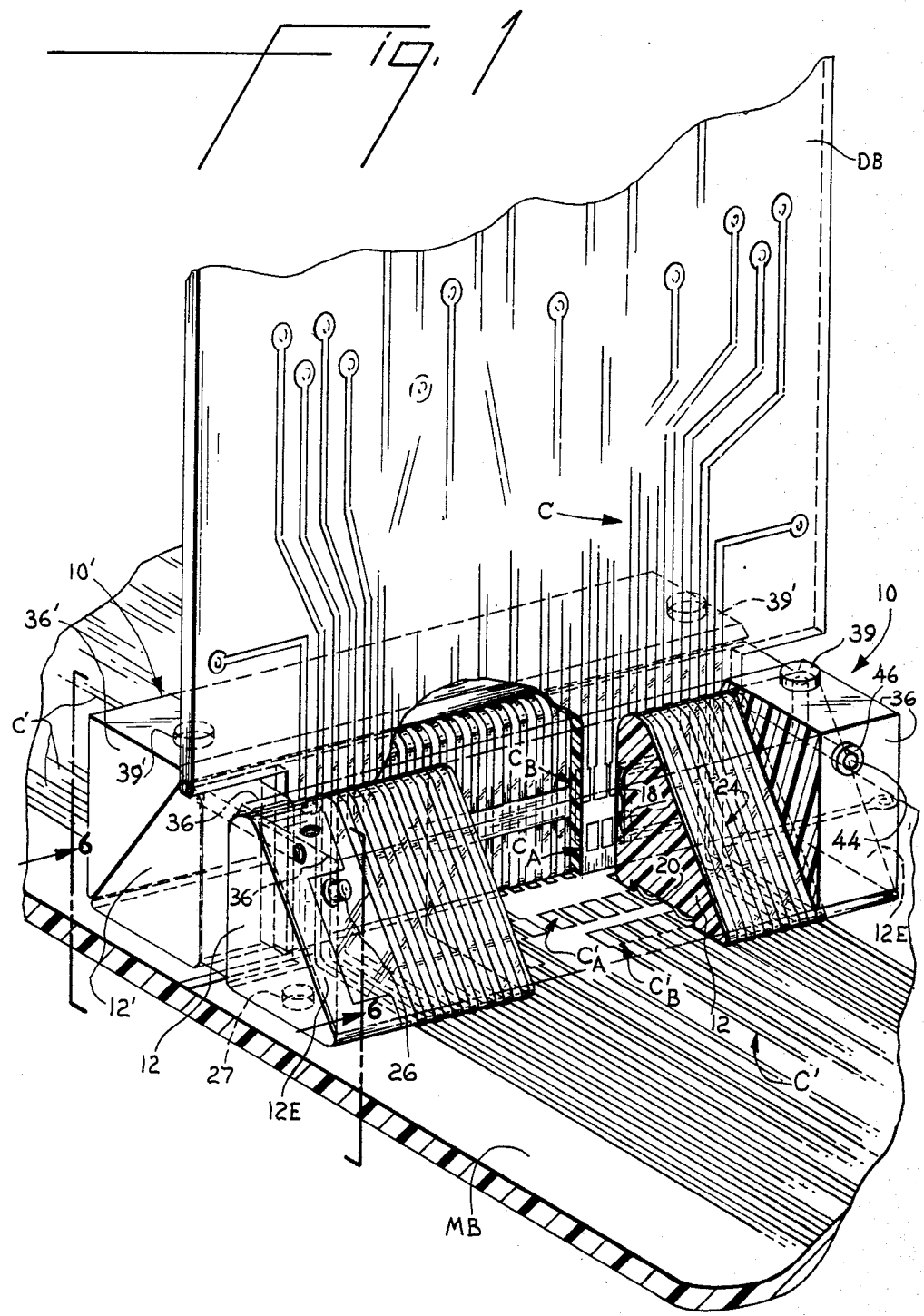

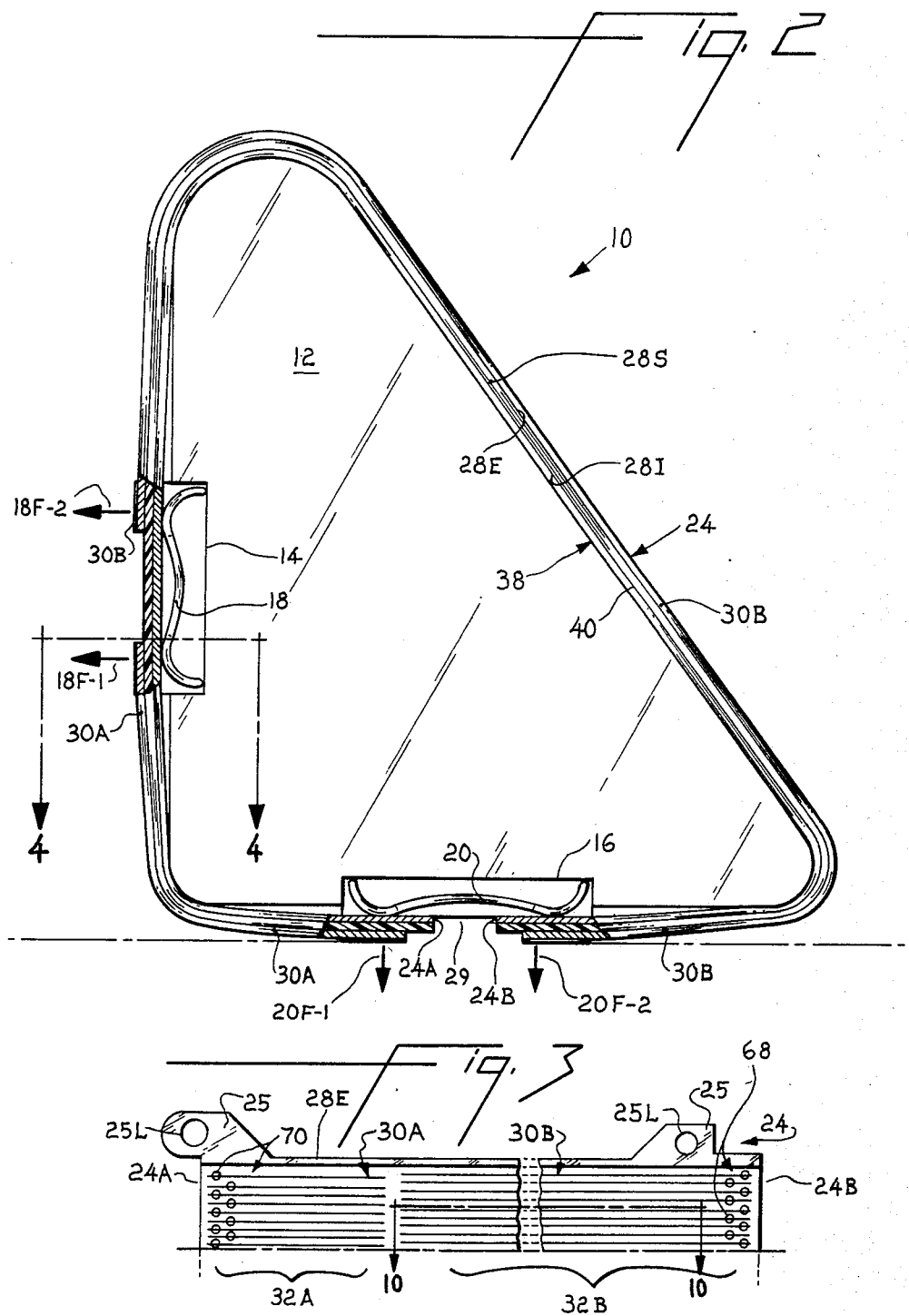

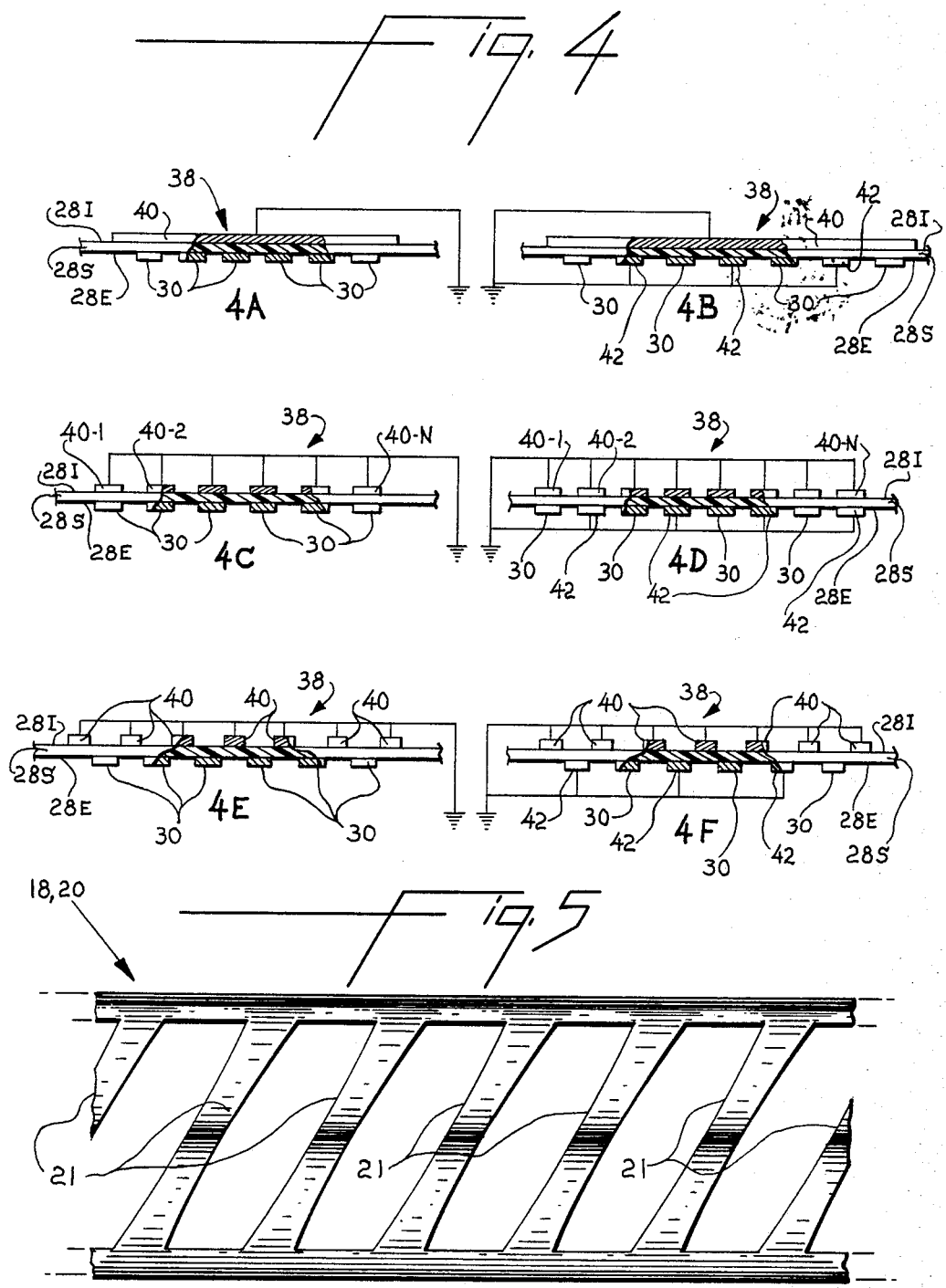

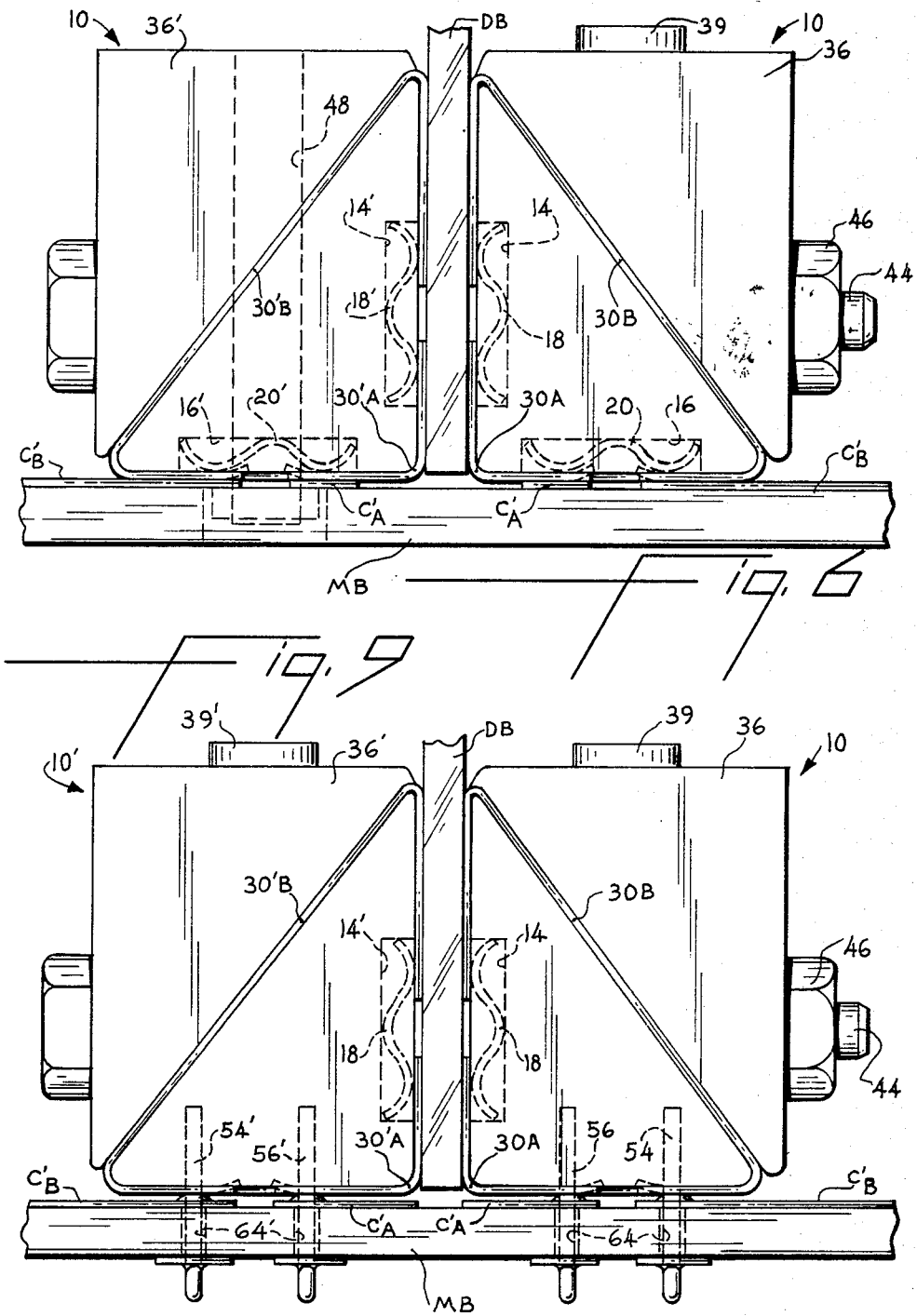

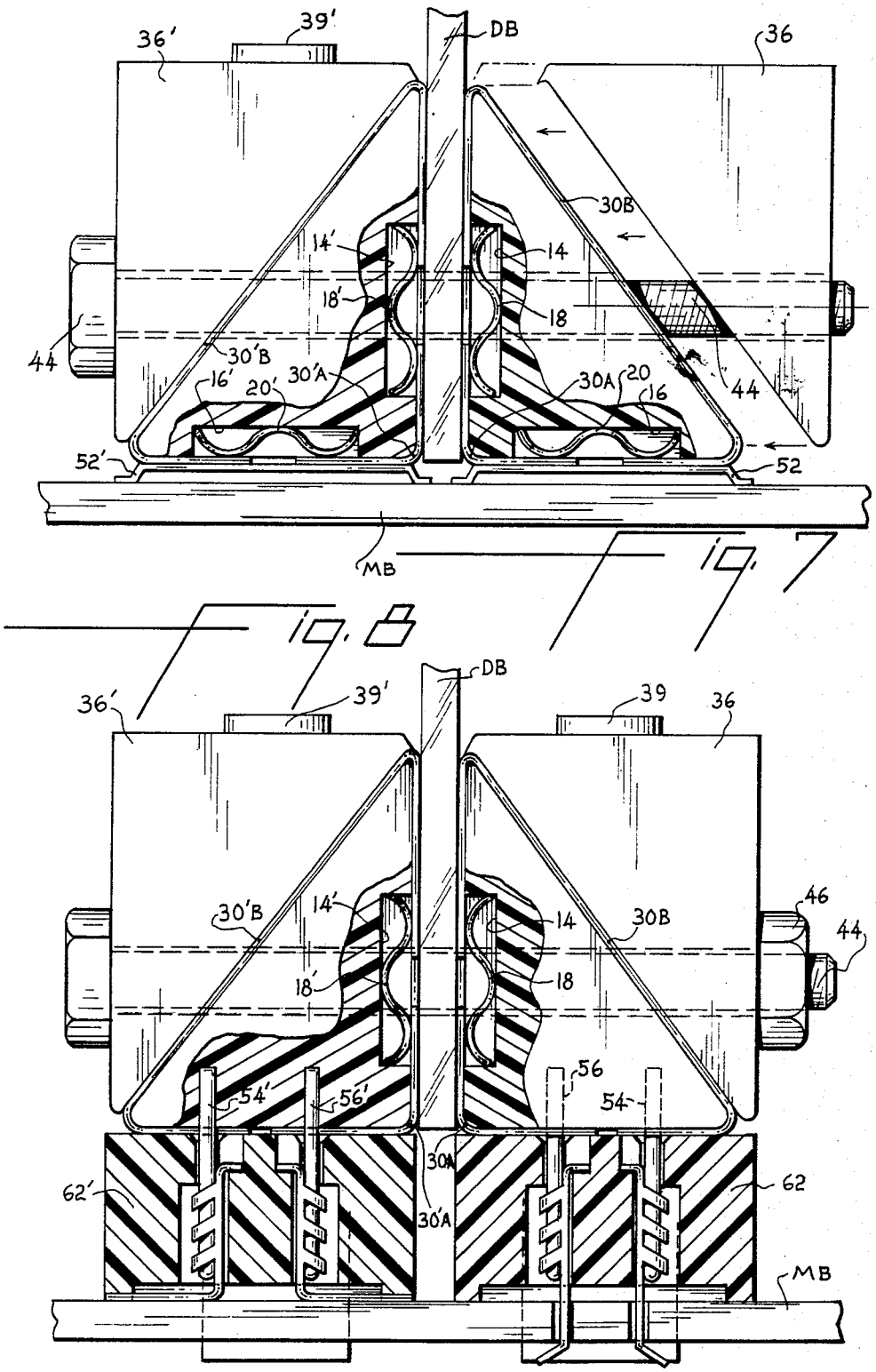

ELECTRICAL CONNECTOR USING A FLEXIBLE CIRCUIT HAVING AN IMPEDANCE CONTROL ARRANGEMENT THEREON

BACKGROUND OF THE INVENTION

1. Field of the Invention

This invention relates to an electrical connector using a flexible circuit and, in particular, to a connector having a flexible circuit provided with an impedance control arrangement.

2. Description of The Prior Art

Recent advances in very large scale integrated (VLSI) circuit fabrication technology have resulted in the ability to produce chips able to accomodate increasingly larger numbers of input and output (I/O) signals. This increase in signal density has required a concomitant increase in the ability of electrical connectors to effectively interconnect signals carried by conduction paths disposed on a first substrate having such a chip thereon with corresponding conduction paths disposed on a second substrate.

In addition to increased signal density, the circuit performance of chips fabricated using emerging technologies in terms of operating frequency has also been drastically increased. For example, by fabricating chips using emitter coupled logic, integrated injection logic or other emerging technologies, the operating frequencies are advancing beyond the operating frequencies attainable by standard transistor-transistor logic technology. Thus, to avoid errors in data transmissions at these operating frequencies, connectors must provide electronic characteristics comparable to the electronic circuits themselves in order to insure that signal quality is maintained during the transmission through the connector from conduction paths on one substrate to those on another.

The quality of the transmitted signal from one substrate, through a connector, to another substrate depends generally upon the magnitude of signal reflection due to the interface between the conduction paths on each substrate and the conduction tracings on the connector and upon the degree of cross talk between adjacent conduction tracings on the connector.

With regard to reflections, the amount of reflected energy is dependent upon the magnitude of change in characteristic impedance (hereafter referred to as "impedance") between a conduction path on a substrate and a conduction tracing on the connector, as well as the frequency of the signals involved. When impedance mismatches occur, the transmitted energy pulse is distorted. This causes errors in data transmission. Moreover, high frequency pulse rates with very rapid rise times such as encountered in chips fabricated using emerging integrated circuit fabrication technologies exacerbate the problem of energy reflection when such pulses encounter a large impedance mismatch.

Cross talk is the interference to a signal carried by one electrical path caused by an adjacent path. With this phenomenon the adjacent paths may not only lose signal integrity, but may also contaminate each other, further increasing errors in transmission. Cross talk interference is caused by inductive and/or capacitive couplings existing between the electrical conduction tracings.

To satisfy the density problem the art has responded with a number of high density connectors. Some of these connectors, found to be especially useful in high density applications, (with spacings between conduction paths as low as 0.050 inches) use flexible circuits in their constructions. Exemplary of such connectors are those described in U.S. Pat. Nos. 4,227,767 and 4,248,491, both issued to Mouissie and both assigned to the assignee of the present invention. A flexible circuit is a conducting element formed using a substrate of a flexible dielectric material, such as a polyimide film sold by E. I. du Pont de Nemours and Company under the trademark Kapton ®, which is provided with conductive tracings on one surface thereof. Other connecting devices using the flexible circuits are disclosed in U.S. Pat. Nos. 3,614,707 (Kaufmann et al.); 4,357,750 (Ostman); 3,843,951 (Maheaux); 3,936,119 (Ayer); 3,951,493 (Kozel et al.); 3,999,826 (Yurtin); 4,019,758 (Zielinski); 4,092,057 (Walton); 4,184,729 (Parks et al.) and 4,173,381 (Allmark et al.). However, such connectors do not appear to address the problem of insuring the quality of transmitted signals nor do they appear to disclose techniques by which conduction tracings having spacings below 0.050 inches may be interconnected.

In view of the foregoing, it is believed desirable to provide a high density electrical conductor compatible for use with the high density (at less than 0.050 inch spacings) I/O circuit elements fabricated with the most recent technology and to do so using a flexible connecting circuit with its inherent advantages, and yet further to provide an impedance control arrangement to effectively minimize signal reflections and/or cross talk which degrade transmitted signal quality.

SUMMARY OF THE INVENTION

In accordance with the present invention, a connector is provided for electrically interconnecting an array of signal conduction paths on a first substrate with a corresponding array of conduction paths on a second substrate where the spacings between conduction paths are closely spaced apart. Such a connector may be typically used to connect two substrates, such as a daughter board to a mother board on the interior of a chassis or console.

The connector comprises a core formed of a dielectric material around which is wrapped a flexible circuit. The ends of the flexible circuit are secured to the core and are preferably spaced from each other. A first, or exterior, surface of the flexible circuit is provided with an array of signal conduction tracings corresponding in number and adapted to register with the conduction paths on each of the substrates between which interconnection is desired. The opposite, second, or interior, surface of the flexible circuit is provided with an impedance control arrangement arranged in such a manner as to control the impedance of the conduction tracings on the exterior surface of the flexible circuit to thereby effectively match the impedance of the conduction paths on the substrates joined by the tracings of the connector, thus minimizing signal reflections which degrade circuit performance.

The impedance control arrangement typically comprises one or more conductive ground tracings. The particular physical arrangement and spacing of the ground tracings on the flexible circuit are selected to provide close impedance matching between the conduction tracings on the flexible circuit and the conduction paths on the substrate to be electrically connected. This arrangement also reduces cross talk. The exterior surface of the flexible circuit may be provided with ground lines interspaced between adjacent signal conduction tracings to further minimize cross talk.

BRIEF DESCRIPTION OF THE DRAWINGS

The invention may be more fully understood and the following detailed description thereof taken in connection with the accompanying drawings which form a part of this application and in which:

FIG. 1 is a perspective view of two electrical connectors in accordance with the present invention respectively arranged to connect a high density array of conduction paths on each side of a first substrate to corresponding conduction paths on a second substrate;

FIG. 2 is a side elevational view partially in section of one part of the connectors shown in FIG. 1;

FIG. 3 is a developed view of a flexible circuit used in the connector shown in FIG. 2;

FIGS. 4A through 4F are elevational views taken along section lines 4—4 shown in FIG. 2 illustrating various spatial relationships of the ground tracings in the impedance control arrangement of the present invention;

FIG. 5 is a plan view of a biasing spring used in the connector shown in FIG. 2;

FIG. 6 is a side elevational view taken along view lines 6—6 in FIG. 1 showing the surface mounting of the connector in accordance with the present invention with respect to one of the substrates;

FIGS. 7 through 9 are views similar to FIG. 6 illustrating alternate mounting arrangements whereby the connector in accordance with the present invention may be mounted to one of the substrates.

DETAILED DESCRIPTION OF THE INVENTION

Figure 10:
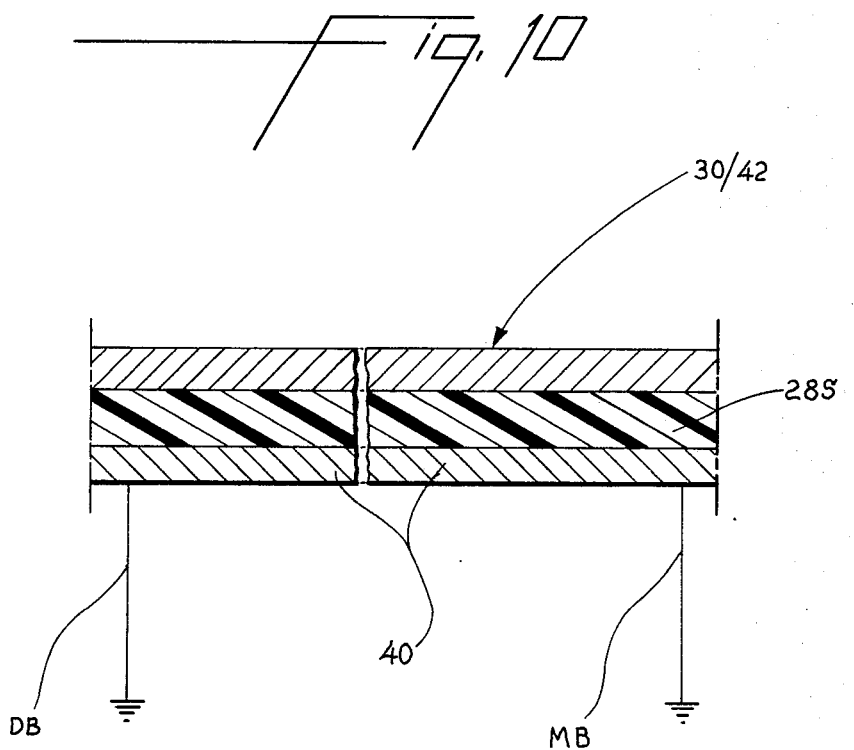
FIG. 10 is an elevational view taken along section lines 10—10 in FIG. 3.

Throughout the following detailed description similar reference numerals refer to similar elements in all Figures of the drawings.

Referring to FIG. 1, a pair of connectors 10 and 10' embodying the teachings of the present invention are shown in an assembled operative relationship wherein each is adapted to interconnect an array of conduction paths C arranged in a predetermined pattern on each of opposed surfaces of a first substrate, typically a daughter circuit board DB, with corresponding ones of an array of conduction paths C' disposed upon the surface of a second substrate, typically a mother circuit board MB. Although shown in the context of interconnecting the conductive paths C on each side of a two-sided daughter board DB with corresponding conduction paths C' on the associated mother board MB, it is to be understood that a connector 10 or 10' embodying the teachings of the present invention may be utilized in any operating environment requiring the interconnection of corresponding conduction paths on each of two substrates. As used herein, the substrates to be interconnected may generally include circuit boards and/or ceramic chip carriers.

As seen in FIG. 1, the arrays of conduction paths C and C' are arranged on their respective substrates in a high density configuration in which selected ones of the arrays of conduction paths have contact pads which lie on their associated substrate below the pads of others of the paths. The former paths are denominated $C_A$ and $C'_A$ while the latter are indicated as $C_B$ and $C'_B$, respectively. The pads in each array may be separated by predetermined spacings, such as 0.050 inches. The pads in one array are offset from the pads in the other array such that the pads on a substrate (as a whole) have spacings somewhat less than 0.050 inches. Fabricating such a conduction path between is usually accomplished by having conduction paths terminating in the array of pads $C_B$ on the surface of the substrate while the paths terminating in the pads $C_A$ are disposed in the interior of the substrate in a manner appreciated by those skilled in the art.

Focusing upon the construction of the connector 10 with the understanding that similar constructional details apply to the connector 10', a connector 10 in accordance with the present invention includes a core 12 formed of a suitable dielectric material such as moldable polyester. The core 12 is preferably formed in a triangular configuration when viewed in side elevation (as seen in FIG. 2) although of course, any suitable predetermined configuration for the core 12 may be utilized. The core 12 is provided with recesses 14 and 16 provided along each surface of the core 12 which is disposed in confrontational relationship to the array of conduction paths on either the daughter board DB or the mother board MB, as the case may be. The recesses 14 and 16 respectively receive biasings springs 18 and 20 (shown in FIG. 5) provided for a purpose described herein.

Wrapped about the periphery of the core 12 intermediate the axial ends 12E thereof is a flexible circuit 24 (shown in FIG. 3). The flexible circuit 24 is preferably arranged such that the terminii 24A and 24B thereof are spaced a predetermined distance 29 apart (FIG. 2). Of course the terminii of the flexible circuit may be suitably overlapped, if desired. The flexible circuit 24 is secured by any suitable means to the core 12 to effect the assembled relationship above described. For example, the flexible circuit 24 may include tabs 25 having eyelets 25L (FIG. 3) therein. The eyelets 25L are received by embosses 26 and 27 (FIG. 1) on the core 12. The circuit 24 is held to the core 12 by the action of the cover 36 and the adjacent substrate when assembled.

The flexible circuit 24 is fabricated from a flexible dielectric material such as an elongated strip of polyimide film 28. Suitable for use as the polyimide film is that sold by E. I. du Pont de Nemours and Company under the trademark Kapton ®, although any other suitable flexible material may be utilized for the film strip 28. The dielectric strip 28S has a first, exterior, surface 28E and a second, interior, surface 28I thereon. The interior surface 28I of the flexible circuit 24 is that surface next adjacent to the peripheral surfaces of the core 12, while the exterior surface 28E is that surface of the flexible surface presented to the substrates DB and MB.

As best seen in FIG. 4, arranged in a predetermined pattern across the exterior surface 28E is an array of conduction tracings 30. The tracings 30 are arranged in registration with the arrays of conduction paths C and C' to facilitate electrical connection between the daughter board DB and the mother board MB. To effect this interconnection in the environment of a high density conduction path pattern as exhibited by the boards DB and MB, the array of conduction tracings 30 on the flexible circuit 24 is subdivided into a first set of tracings 30A and a second set of tracings 30B. Each set of tracings 30A and 30B respectively is offset from each other and extends over predetermined regions 32A and 32B of the exterior surface 28E of the flexible circuit 24. The tracings 30A in the first set are arranged to overlie and electrically contact the conduction paths $C_A$ and $C'_A$ on the boards DB and MB, respectively. Similarly, the tracings 30B of the second set are arranged on the exterior surface 28E of the flexible circuit 24 to overlie and electrically connect the conduction paths $C_B$ and $C'_b$, respectively. The triangular configuration of the core 12 shortens the distance for the tracings 30B, thereby minimizing the propagation delay for signals carried thereby.

The springs 18 and 20 are preferably double-bumped stainless steel springs each of which is arranged within the respective recesses 14 and 16 to impose a pair of biasing forces on the tracings 30 acting in the direction of arrows 18F-1, 18F-2 and 20F-1, 20F-2, respectively, at two contact points for each spring. The biasing forces 18F-1 and 20F-1 imposed on the flexible circuit 24 insure electrical contact between each one of the set of conduction tracings 30A and the corresponding conduction paths $C_A$ and $C'_A$, respectively. Similarly, the biasing forces 18F-2 and 20F-2 insure electrical contact between each one of the set of conduction tracings 30B and the corresponding conduction paths $C_B$ and $C'_B$, respectively. As seen in FIG. 5 the springs 18 or 20 having a substantially ladder-like configuration with adjacent rungs 21 being inclined to match the degree of offset between the pads that terminate the conduction paths $C_A$ and $C_B$ or $C'_A$ and $C'_B$, as the case may be. Thus, each rung 21 biases a portion of a tracing 30A or 30B into contact with the appropriate conduction path on the substrates.

A cover 36 is contoured for receipt upon the core 12 to thereby impart structural rigidity and support for the flexible circuit 24 trained over the core 12. The cover 36 for the connector 10 is shown in phanton in FIG. 1 while the corresponding cover 36' associated with the connector 10' is shown in full outline. The covers 36 are secured to their corresponding cores 12 by any suitable means of attachment such as bolts 39 extending through the covers and into a portion of the ends 12E of the cores 12.

In accordance with the present invention the interior surface 28I of the flexible circuit 24 is provided with an impedance control arrangement generally indicated by reference character 38. The impedance control arrangement 38 in accordance with this invention comprises one or more ground tracings 40 provided on the interior surface 28I. Both the conduction tracings 30 and the ground tracings 40 may be provided in the form of copper or other conductive material adhesively attached or otherwise deposited on the appropriate surface of the flexible circuit 24 and etched to form the pattern of conduction tracings 30 and ground tracings 40 desired. With reference to FIGS. 4A through 4F, a more detailed depiction of the arrangement of the ground tracings 40 across the interior surface 28I of the dielectric strip 28S used in the flexible circuit 24 is shown. Of course, the signal conduction tracings 30 and the ground tracings 40 may be reversed exterior and interior with respect to the strip 28S.

In one embodiment of the invention shown in FIGS. 4A and 4B the impedance control arrangement 38 includes a single ground tracing 40 disposed across the interior surface 28I with a width dimension laterally encompassing the entirety of the signal conduction tracings 30 provided on the exterior support 28E. In a first alternate embodiment of the invention shown in FIGS. 4C and 4D, the impedance control arrangement 38 takes the form of an array of ground tracings 40-1 through 40-N. The number N of ground tracings 40 in accordance with this embodiment corresponds on a one-to-one relationship with the signal conduction tracings 30. As seen in FIGS. 4C and 4D, each of the ground tracings 40 lies in vertical alignment with the corresponding conduction tracing 30.

A yet further alternate embodiment of the invention is shown in FIGS. 4E and 4F, in which the ground tracings 40 are in staggered relationship with respect to the signal conduction tracings 30 such that a ground tracing 40 on the surface 28I lies in the space between each signal conduction tracing 30 on the surface 28E. In each embodiment of the invention shown in FIGS. 4A through 4F the ground tracings 40 extend along the interior surface 28I of the dielectric strip 28S for a distance axially encompassing the entire lengths of the conduction tracing 30A and 30B (FIG. 3). For considerations of mechanical convenience in the regions of the springs 18, 20 the ground tracings may be interrupted, if desired.

The ground tracings 40 on the interior surface 28I of the flexible circuit 24 are connectable to ground potential in any convenient manner. As shown in FIG. 10, the ground tracings 40 are the signal return conductors and are therefore connected at each end to the daughter board DB and the mother board MB respectively by a ground potential connection. In addition, it is frequent practice that one (or more) of the signal conduction tracings 30 are, in fact, used as signal returns. Accordingly, the ground tracings 40 may be conveniently connected with the tracing(s) 30 used as the signal return. This connection may be made by forming a via or opening in the strip 28S in the vicinity where interconnection is desired. Thereafter, the ground tracings 40 may be connected to the return by soldering, by attaching a rivet, by soldering a pin, or by permitting copper in the tracings on each surface of the strip to dip into the opening to establish electrical contact.

As a further detail of the present invention, as may be appreciated from examination of FIGS. 4B, 4D, and 4F, the exterior surface 28E may be further provided with at least one ground tracing 42 disposed between each pair of signal conduction tracings 30. As discussed, some of these tracings 42 may serve as signal return, which is, in effect, ground potential. The tracings 42 further minimize cross talk and assist in impedance control.

The entire structural arrangement of the connector, including the dimensions of the signal conduction tracings 30 and of the ground tracings 40, 42; the relative distances between the tracings 30 and the tracings 40, 42; the overlap of the ground tracings 40 with respect to the signal conduction tracings 30; and the thickness of the dielectric strip 28S are dictated by the same considerations of electrical theory utilized when providing a specific characteristic impedance for a transmission structure such as other flexible or nonflexible circuits. Thus, once provided with a predetermined characteristic impedance of the conduction paths C and C' on the substrates to be interconnected, the above-discussed physical spacing parameters of the ground tracings 40, 42 with respect to the signal conduction tracings 30 may be readily determined by those skilled in the art. To ascertain these parameters, reference may be made to, among others, *The Handbook of Wiring, Cabling and Interconnecting for Electronics,* Charles A. Harper, Editor-in-Chief, McGraw Hill Book Company, 1972; The Proceedings of the IEEE Professional Program Session Record No. 18 entitled "Transporting High-Speed Digital Signals Point-to-Point on Circuit Board Assemblies"; Frey, *Microwave Integrated Circuits,* Copyright 1975, reprinted 1977 by Artech House Inc.; and Marshall, *Flat Cable Applications in the Signal Transmission Line Field,* published by Ansley Electronics, Inc.

The connector or connectors 10 to 10' in accordance with the present invention may be mounted, as the application dictates, with respect to the substrates with which they are to be utilized in any of a variety of manners. As shown in FIGS. 1, 2 and 6, each connector 10 or 10' may be physically joined to one of the substrates, typically the daughter board DB, as by a through bolt 44 and lock nut 46. The connector 10 is itself provided with bosses 27 which are adapted to be received in openings in the other of the substrate MB to thereby register the connector 10 therewith. Of course, it is possible to mount the connectors 10, 10' to the other substrate, in this instance the mother board MB, by a similar through bolt extending vertically through bolt openings such as shown at 48 in FIG. 6.

Alternate mounting configurations are shown in FIGS. 7, 8 and 9. In FIG. 7, instead of the surface mount to the mother board MB as shown in FIG. 6, the connector is secured by suitable means to a lead frame or contacting tabs 52, 52' which are in turn secured by any suitable means, such as soldering, to the surface of the mother board. Alternatively, as shown in FIGS. 8 and 9, the connector 10 may be provided with pin connections 54 and 56 which intersect and are attached to (typically by solder) the signal conduction tracings 30 in each set thereof. The pins 54 and 56 are adapted to be received either by rib cage sockets 62 or plated holes 64 as shown in FIGS. 8 and 9, respectively. The sockets 62 and plated holes 64 are secured and intimately contacted to the appropriate ones of the conduction paths C'$_A$ and C'$_B$ on the mother board MB. To accomodate the signal density afforded by a connector of the present invention the pins 54, 56 are arranged to extend through vias or holes 68, 70 disposed in a zigzag pattern with respect to the signal conduction tracings 30A and 30B (FIG. 3). The holes 68, 70 are arranged in two rows with predetermined spacings (e.g., 0.050 inches), thus effectively providing spacings on the order of 0.025 inches.

Although the discussion above discloses the signal conduction tracings on the first or exterior surface and the ground tracings on the second or interior surface, this arrangement may be reversed if suitable vias are provided to conduct signal or ground tracings, as the case may be, through the dielectric strip 28S.

Those skilled in the art may readily appreciate that hereinabove described is a connector adapted to interconnect a first substrate and a second substrate using a high density flexible circuit connector which provides up to a threefold higher density than presently available with 0.050 inch center connector technology and which simultaneously provides effective impedance matching and cross talk protection to maximize signal transfer from one conduction path to the other through the connector.

Those skilled in the art, having benefits of the teachings as hereinabove set forth, may effect numerous modifications thereto, lying within the scope of the present invention as defined by the appended claims.

What is claimed is:

1. An electrical connector for electrically connecting an array of signal conduction paths disposed on a first substrate with a corresponding array of signal conduction paths disposed on a second substrate, the connector comprising:
   a core;
   a flexible circuit wrapped around the core, the flexible circuit having thereon a first surface and a second surface;
   an array of signal conduction tracings disposed on the first surface of the flexible circuit, the signal conduction tracings being arranged to electrically contact corresponding ones of the signal conduction paths on the first and the second substrates;
   an impedance control arrangement disposed on the second surface of the flexible circuit comprising at least one ground tracing carrying a signal return current through a ground potential connection at both ends of the ground tracing, the ground tracing being arranged with respect to the signal conduction tracings on the first surface so that the impedance of the signal conduction tracings matches the impedance of the corresponding conduction paths on the first and second substrates.

2. The electrical connector of claim 1 wherein the array of signal conduction tracings on the first surface of the flexible circuit comprises a first and a second set of conduction tracings, the tracings of the first set extending over a first predetermined region of the first surface of the flexible circuit while the second set extends over a second predetermined region of the first surface of the flexible circuit different from the first region.

3. The electrical connector of claim 1 wherein the ground tracing is a plane extending over the second surface of the flexible circuit for a distance laterally encompassing the array of signal conduction tracings disposed on the first surface of the flexible circuit.

4. The electrical connector of claim 2 wherein the ground tracing is a plane extending over the first and second predetermined regions laterally encompassing the conduction tracings.

5. The electrical connector of claim 1 wherein the impedance control arrangement comprises an array of ground tracings disposed on the second surface of the flexible circuit in one-to-one correspondence with and in vertical alignment with each of the signal conduction tracings on the first surface of the flexible circuit.

6. The electrical connector of claim 2 wherein the impedance control arrangement comprises an array of ground tracings disposed on the second surface of the flexible circuit in one-to-one correspondence with and in vertical alignment with each of the signal conduction tracings on the first surface of the flexible circuit.

7. The electrical connector of claim 1 wherein the impedance control arrangement comprises an array of ground tracings disposed on the second surface of the flexible circuit in the spaces between the signal conduction tracings on the first surface of the flexible circuit.

8. The electrical connector of claim 2 wherein the impedance control arrangement comprises an array of ground tracings disposed on the second surface of the flexible circuit in the spaces between the signal conduction tracings on the first surface of the flexible circuit.

9. The electrical connector of claim 1 further comprising at least one ground tracing disposed on the first surface of the flexible circuit between each pair of signal conduction tracings.

10. The electrical connector of claim 2 further comprising at least one ground tracing disposed on the first surface of the flexible circuit between each pair of signal conduction tracings in each set of signal conduction tracings.

11. The electrical connector of claim 3 further comprising at least one ground tracing disposed on the first surface of the flexible circuit between each pair of signal conduction tracings.

12. The electrical connector of claim 4 further comprising at least one ground tracing disposed on the first surface of the flexible circuit between each pair of signal conduction tracings in each set of signal conduction tracings.

13. The electrical connector of claim 5 further comprising at least one ground tracing disposed on the first surface of the flexible circuit between each pair of signal conduction tracings.

14. The electrical connector of claim 6 further comprising at least one ground tracing disposed on the first surface of the flexible circuit between each pair of signal conduction tracings in each set of signal conduction tracings.

15. The electrical connector of claim 7 further comprising at least one ground tracing disposed on the first surface of the flexible circuit between each pair of signal conduction tracings.

16. The electrical connector of claim 8 further comprising at least one ground tracing disposed on the first surface of the flexible circuit between each pair of signal conduction tracings in each set of signal conduction tracings.

17. The electrical connector of claim 1 wherein the conduction paths on each substrate are subdivisible into first and second sets, the paths in each set being offset with respect to each other, wherein the impedance control arrangement comprises:
 a first and second recess disposed in the core in confrontational relationship with respect to the first and second substrate;
 a biasing spring disposed in each recess, each spring having an array of rungs thereon, the rungs being inclined such that each rung biases a portion of a tracing in each set of tracings into contact with a conduction path on the first and second substrates.

18. The electrical connector of claim 1 wherein the ground tracing is connectable to ground potential through a via provided in the flexible circuit.

19. The electrical connector of claim 2 wherein the ground tracing is connectable to ground potential through a via provided in the flexible circuit.

20. The electrical connector of claim 1 wherein the flexible circuit is connected to at least one substrate by a lead frame.

21. The electrical connector of claim 1 wherein the flexible circuit is connected to at least one substrate by conductive pins.

22. The electrical connector of claim 21 wherein each conductive pin is in contact with the flexible circuit and embedded in the core and contacts at least one substrate through another terminal affixed to the substrate.

* * * * *